United States Patent [19]

Takigawa et al.

[11] 4,430,570

[45] Feb. 7, 1984

[54] ELECTRON BEAM EXPOSING APPARATUS

[75] Inventors: Tadahiro Takigawa, Tokyo; Isao Sasaki, Chiba, both of Japan

[73] Assignee: Tokyo Shibaura Denki Kabushiki Kaisha, Kawasaki, Japan

[21] Appl. No.: 213,026

[22] Filed: Dec. 4, 1980

[30] Foreign Application Priority Data

Dec. 5, 1979 [JP] Japan .................... 54-156915

[51] Int. Cl.$^3$ ............................... H01J 1/16
[52] U.S. Cl. .................... 250/423 R; 313/336; 250/396 R
[58] Field of Search ............... 250/423 R, 492.2, 396; 313/336, 346

[56] References Cited

U.S. PATENT DOCUMENTS

| 4,054,946 | | Duncan ................. 313/346 R |
| 4,055,780 | 10/1977 | Kawai et al. .................. 313/336 |
| 4,137,476 | 1/1979 | Ishii et al. ................. 313/346 R |
| 4,182,958 | 1/1980 | Goto et al. ................. 250/492.2 |
| 4,193,013 | | Futamoto et al. ............. 313/341 |
| 4,243,866 | 1/1981 | Pfeiffer et al. ............ 250/492.2 |
| 4,258,283 | 3/1981 | Brünger et al. ............... 313/336 |
| 4,346,325 | 8/1982 | Nakasuji et al. .............. 313/336 |

FOREIGN PATENT DOCUMENTS

2049270 United Kingdom.

OTHER PUBLICATIONS

IEEE TRANSACTIONS ON ELECTRON DEVICES, Vol. ED 26, No. 4, April 1979, NY, PFEIFFER: Recent Advances in Electron-Beam Lithography for the High-Volume Production of VLSI Devices pps. 663–674.

*Primary Examiner*—Bruce C. Anderson
*Attorney, Agent, or Firm*—Oblon, Fisher, Spivak, McClelland & Maier

[57] ABSTRACT

A variable shaping type electron beam exposing apparatus is provided which comprises an electron gun which irradiates an electron beam from the front end of a cathode chip; shaping plates having openings of variable shapes for shaping the electron beam irradiated from the electron gun into the shapes of these openings; and an objective lens for focusing the electron beam passed through the shaping plates into a predetermined shape on a sample. In this apparatus, the cathode chip is made of single-crystal lanthanum hexaboride whose axial orientation is <310>, the front end of it is formed into a circular conical shape, and half the vertical angle of the front end is set to be between 60° and 85°. The maximum area of the image on the sample is between 2 to 50 $\mu m^2$.

6 Claims, 25 Drawing Figures

FIG.7A   FIG.7B   FIG.7C   FIG.7D
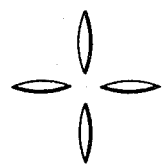 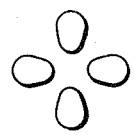  
FIG.8A   FIG.8B   FIG.8C   FIG.8D
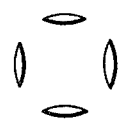 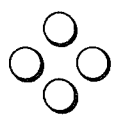  
FIG.9A  FIG.9B  FIG.9C  FIG.9D  FIG.9E
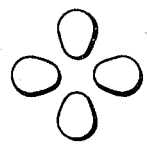 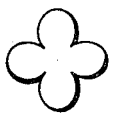   
FIG.10A  FIG.10B  FIG.10C  FIG.10D  FIG.10E
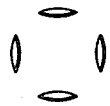    

ELECTRON BEAM EXPOSING APPARATUS

BACKGROUND OF THE INVENTION

1. Field of the Invention

The present invention relates to an electron beam exposing apparatus and, more particularly, to a variable shaping electron beam exposing apparatus.

2. Description of the Prior Art

It has been recent practice to expose a resist to light using an electron beam for ultrafine processing for forming the planar shape of an LSI in the resist. A pattern in generally formed on the resist by scanning an electron beam converging to a spot. However, a variable shaping electron beam exposing apparatus has been proposed to form a drawn image with an electron beam in advance and to project the image on the resist for improving the exposing speed. With this apparatus, the electron beam irradiated from an electron gun is shaped by two shaping plates which have square openings and which are superposed on each other with their axes shifted from each other. The image at the openings of the shaping plates will be referred to as an aperture image hereinafter. For drawing a distinct pattern on the resist, this device must satisfy the following three requirements. First, the spread of the electron beam due to the space-charge effect or the Belcher effect must be kept under a certain value so that the pattern will not be blurred. The spread of the electron beam and the luminous intensity of the aperture image are inversely proportional to each other. The second requirement is to increase the luminous intensity as much as possible while still keeping the spread of the electron beam below a certain value. Thirdly, the current density in the variably shaped aperture image must be uniform so that the drawin image will not vary in density. The third requirement amounts to requiring that the opening of the first shaping plate be uniformly irradiated by the electron beam from the electron gun.

The first requirement can be satisfied to a certain extent by the geometrical construction of the apparatus. The electronic optical system is generally so constructed that the aperture image is reduced in scale with a plurality of lenses, the electron beam is spread so as to gradually widen the crossover image (image at the focal point of the electron beam irradiated from the electron gun), and the electron beam is focused with an objective lens with a great angular aperture so as to form a small aperture image on the sample. With such a construction, the transmission of the electron beam becomes maximum, and the space-charge effect may be reduced to the minimum.

With a conventional tungsten cathode used in an electron microscope, the service life becomes as short as several tens of hours when the luminous intensity is made greater, and the electron beam intensity may not be made sufficiently great when the spread of the electron beam is suppressed to be below a certain value. Thus, the electron gun having a tungsten cathode is not suitable for an electron beam exposing apparatus of high precision and high luminance.

An electron gun having a single-crystal cathode, especially a lanthanum hexaboride ($LaB_6$) cathode, has been proposed as an electron gun which has a long service life and which provides a sufficient luminance. However, an electron beam exposing apparatus using an $LaB_6$ electron gun which satisfies the two requirements described above, that is, which can draw a uniform image without blurring, has not been realized.

SUMMARY OF THE INVENTION

It is, therefore, the primary object of the present invention to provide an electron beam exposing apparatus which is capable of shaping a pattern of a sufficient luminous intensity on a resist in a uniform manner without blurring, and which has a long service life and high stability.

The above and other objects of the present invention will be accomplished by an electron beam exposing apparatus comprising: an electron gun having a cathode which is made of a material whose ratio of work function to temperature for reaching a vapor pressure of $1 \times 10^{-5}$ Torr is below $1.5 \times 10^{-3}$ eV/deg, and whose front end is shaped in a cone with half the vertical angle being between 60° and 85°; means including openings of variable shaped for shaping the electron beam irradiated from the front end of the electron gun into the shape of the openings; and means for irradiating the electron beam which has passed the shaping means.

BRIEF DESCRIPTION OF THE DRAWINGS

This invention can be more fully understood from the following detailed description when taken in conjunction with the accompanying drawings, in which:

FIGS. 7A to 7D show intensity distribution patterns of the electron beam incident on the aperture image of the electron beam in relation to temperatures when half the vertical angle of the cathode is 45°;

FIGS. 8A to 8D are intensity distribution patterns of the crossover image corresponding to FIGS. 7A to 7D;

FIGS. 9A to 9E show the intensity distribution patterns of the electron beam incident on the aperture image in relation to temperature when half the vertical angle of the cathode is 70°; and FIGS. 10A to 10E show the intensity distribution patterns of the crossover image corresponding to FIGS. 9A to 9E.

DETAILED DESCRIPTION OF THE PREFERRED EMBODIMENTS

Figure 1:
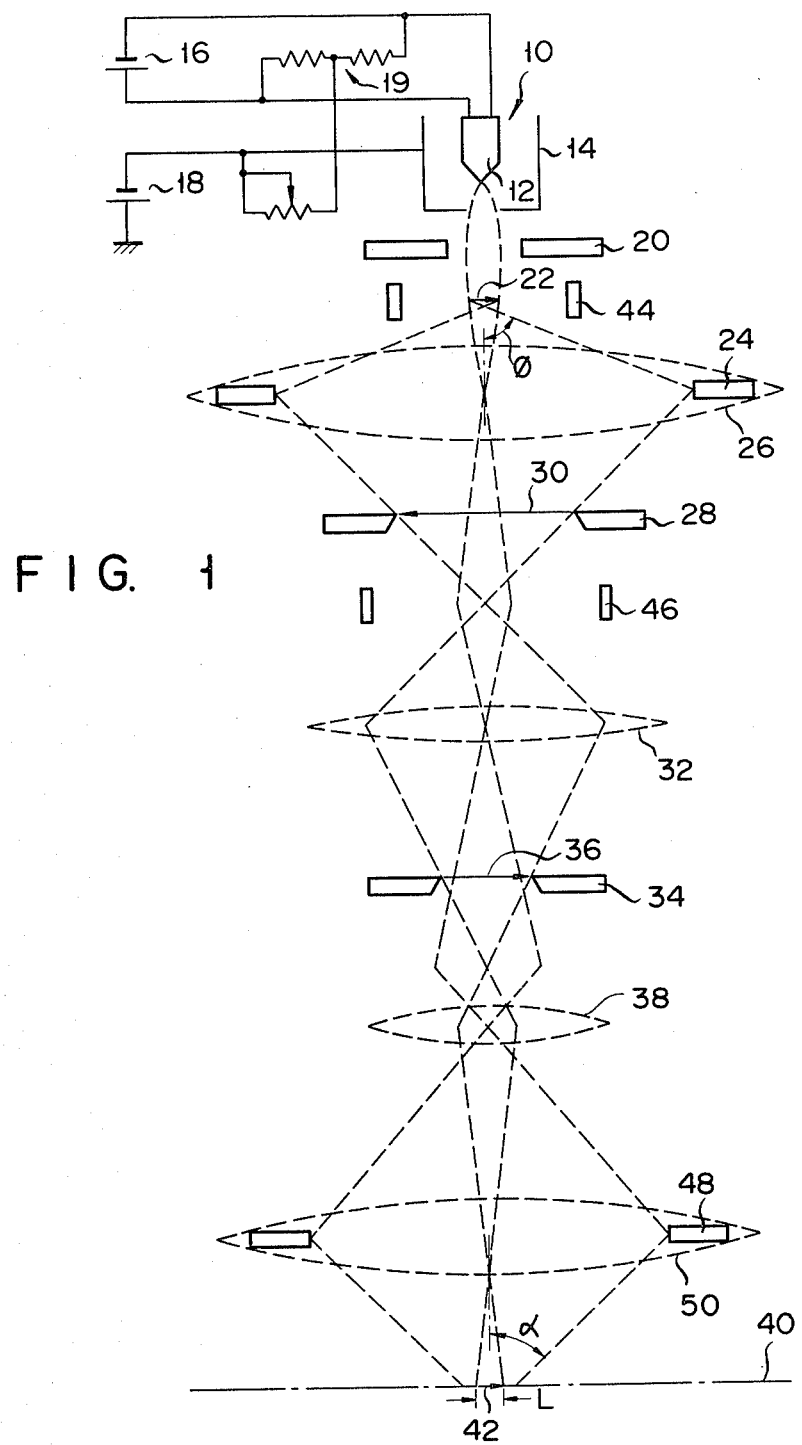
FIG. 1 is a schematic view illustrating the construction of one embodiment of an electron beam exposing apparatus of the present invention.

One embodiment of the electron beam exposing apparatus of the present invention will be described with reference to the accompanying drawings. FIG. 1 is a schematic view illustrating the construction thereof. An electron gun 10 comprises a cathode 12 and a wehnelt electrode 14. The cathode 12 is connected to a heater power source 16. The wehnelt electrode 14 is connected to a high voltage power source 18. The heater power source 16 is connected to the high voltage power source 18 through a bias resistor 19. The electron beam irradiated from the front end of the cathode 12 is accelerated at an anode 20. After being converged, the electron beam forms a crossover image 22 and illuminates a first shaping plate 28 through a lighting electron lens 26 having a scattering preventive plate 24. A first aperature 30 is considered as a light source in this optical system. The first aperature 30 forms a second aperture image 36 at the opening of a second shaping plate 34 through an image forming electron lens 32. The second aperture image 36 further forms an aperture image 42 on a sample 40 through a reducing electron lens 38. The first and second shaping plates 28 and 34 have square openings, and the aperture image 42 may be formed into any rectangular shape by shifting these superposed openings relative to each other. A blanking electrode 44 is interposed between the anode 20 and the lighting electron lens 26. A polarizing plate 46 for shaping the electron beam is interposed between the first shaping plate 28 and the electron lens 32. An objective electron lens 50 having a scattering preventive plate 48 is interposed between the electron lens 38 and the sample 40.

Figure 2A:
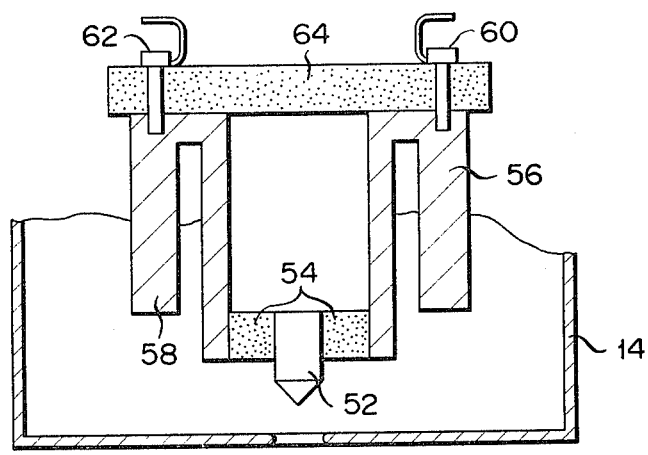
FIG. 2A is a sectional view illustrating in detail the electron gun of FIG. 1.
Figure 2B:
FIG. 2B is a perspectiv view illustrating the cathode of FIG. 2A.
Figure 2B:
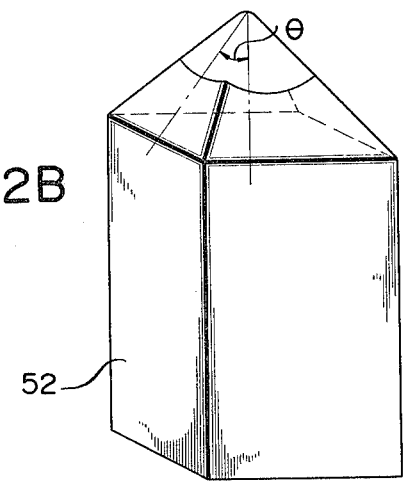
Figure 3:
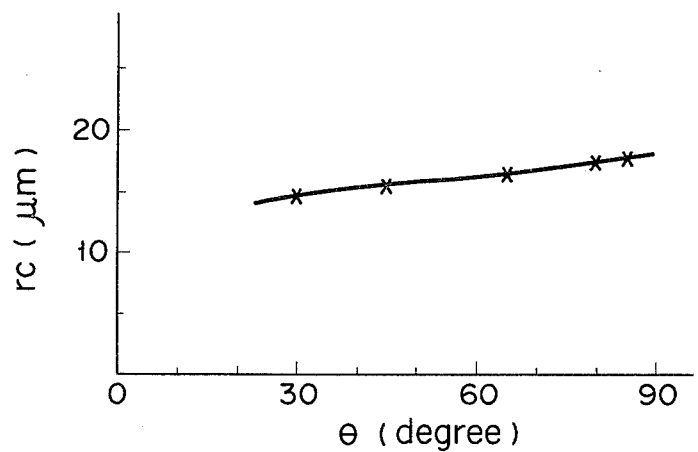
FIGS. 3 to 6 are graphs illustrating the characteristic of this embodiment in relation to half the angle of the vertex of the cathode.
Figure 4:
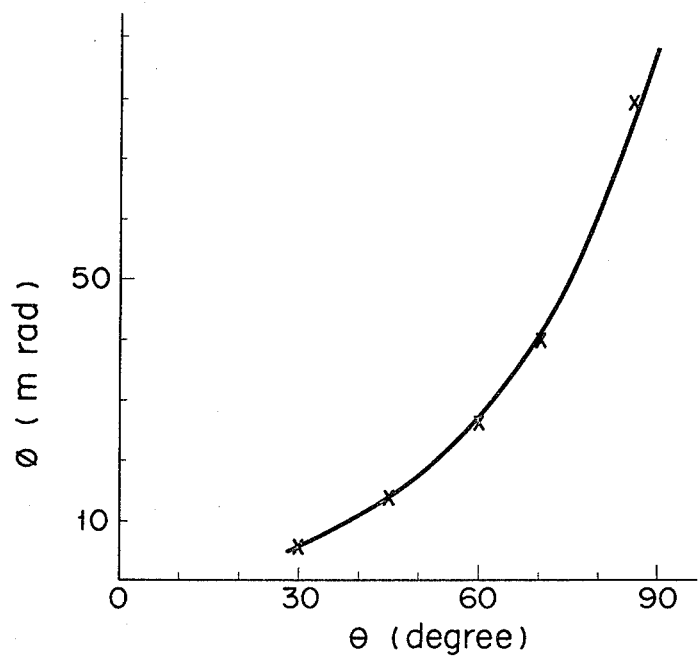

The electron gun 10 will be described in more detail referring to FIGS. 2A and 2B. A cathode chip 52 is made of single-crystal lanthanum hexaboride (LaB$_6$). The cathode chip forms a rectangular pyramid at its front end as shown in FIG. 2B. The front end of the rectangular pyramid is formed into a circular cone, with the vertex of the cone being rounded into a spherical shape. Half the vertical angle of the circular cone will be represented by $\theta$, and the optimal value for $\theta$ will be described hereinafter. The cathode chip 52 is clamped by a pair of holding members 56 and 58 through a heater 54. The holding members 56 and 58 secured to an insulator 64 by screws 60 and 62, respectively. A heating current is supplied from the heater power source 16 to the cathode chip 52 through the holding members 56 and 58.

The mode of operation of this embodiment will now be described. Since an LaB$_6$ electron gun is used in this embodiment, it is possible to draw an aperture image of great luminous intensity, and an apparatus of long service life may be realized. However, the first and third requirements of preventing blurring and ununiformity of the aperture image are not necessarily satisfied. These requirements will be further analyzed for finding the conditions of an apparatus for satisfying these requirements, and an apparatus will be manufactured according to these requirements.

The spread $\delta\omega$ of the electron beam by the space-charge effect may be represented as follows:

$$\delta\omega = KID/\alpha V^{3/2} \qquad (1)$$

where I is the total current reaching the sample 40; $\alpha$ is half the vertical angle of the electron beam focused by the objective lens 50; D is the travel distance of the electron beam, i.e., the distance between the first shaping plate 28 and the sample 40; K is a constant approximately equal to 1; and V is the accelerating voltge supplied to the cathode 12. As may be apparent from equation (1), the spread $\delta\omega$ of the electron beam and the total current I are proportional. For suppressing the spread $\delta\omega$ of the electron beam below 0.1 $\mu$m, it is known that the total current I may not be over 1 $\mu$A, since V=20 kV and $\alpha = 10^{-2}$ rad in a conventional apparatus. This is because D cannot be made smaller than about 300 mm due to the geometrical reguirements of the apparatus. The second and third requirements will be analyzed assuming $\delta\omega = 0.1$ $\mu$m and I=1 $\mu$A.

The luminous intensity B may then be given by the following equation:

$$B = I/\pi\alpha^2 S \qquad (2)$$

where S is the area of the aperture image.

The area of the aperture image must be assumbed in order to quantify the second requirement. In order that the second requirement be satisfied with any kind of apparatus, two kinds of apparatus will be considered wherein the maximum area of the aperture image is 3 $\mu$m $\times$ 0.7 $\mu$m = 2 $\mu$m$^2$, and 7 $\mu$m $\times$ 7 $\mu$m = 50 $\mu$m$^2$. The first apparatus is considered to be suitable for drawing a pattern of fine dimensions. The first case will first be considered.

Since I=1 $\mu$A and S=2 $\mu$m$^2$, the luminous intensity may be obtained from equation (2) as follows:

$$B = 1.6 \times 10^5 \approx 2 \times 10^5 \, A/cm^2 \cdot str \qquad (3)$$

The luminous intensity may be obtained as follows for the other apparatus where S=50 $\mu$m$^2$:

$$B = 6 \times 10^3 \, A/cm^2 \cdot str \qquad (4)$$

Considering the third requirement, the theorem of Helmholtz-Lagrange must be satisfied for obtaining uniform current density in the aperture image. The theorem of Helmholtz-Lagrange may be represented by the following equation:

$$\phi R = \alpha L \qquad (5)$$

where L is the diameter of a circumcircle circumscribing the area of required uniform brightness on the sample, i.e., the rectangular aperture image; R is the diameter of the electron beam at the first crossover; and $\phi$ is half the diverging angle at an area where the electron beam density at the first crossover is substantially constant.

Similarly to the case of the second requirement, the third requirement will be considered with reference to two cases. Since the diameter L of the circumcircle of the aperture image is 4.2 $\mu$m with the apparatus wherein the maximum area of the aperture image is 2 $\mu$m$^2$, it suffices that the following relation be satisfied:

$$\phi R \geqq 40 \, mrad \cdot \mu m \qquad (6)$$

With an apparatus wherein the maximum area of the aperture image is 50 $\mu$m$^2$, it suffices that the following relation be satisfied:

$$\phi R \geqq 100 \, mrad \cdot \mu m \qquad (7)$$

where L=$7\sqrt{2}$=10 $\mu$m.

Although the spread $\delta\omega$ of the electron beam is suppress to be less than 0.1 $\mu$m, the luminous intensity B may be increased for increasing the current density when the allowable value of the spread is higher.

When the above four conditional relations (3) (4), (6) and (7) are satisfied, the extreme use conditions may be considered to be satisfied so that a suitable apparatus as a variable shaping type electron beam exposing apparatus may be realized.

Figure 5:
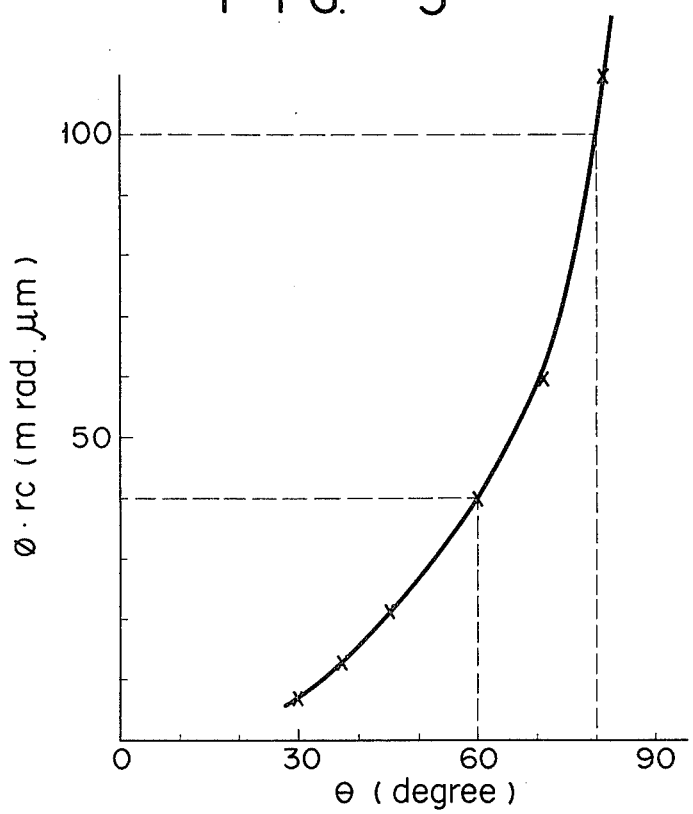
Figure 6:
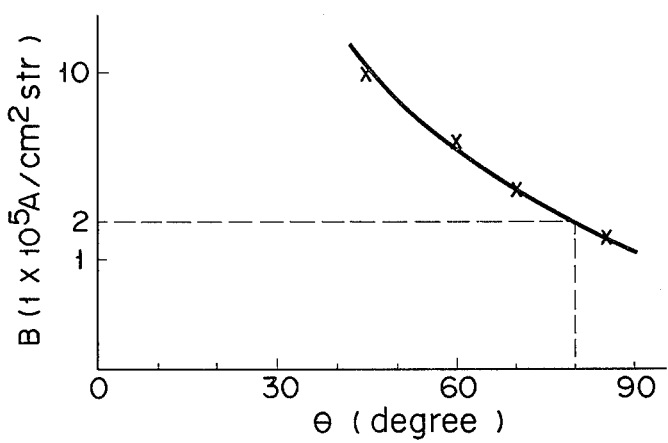

The product $\phi R$ of the diameter R of the first crossover image and half the diverging angle $\phi$ of the electron beam forming the first crossover image; and the luminous intesnity B of the aperture image and shown in FIGS. 3 to 6 as a function of $\theta$, half the vertical angle at the front end of the cathode chip 52 of the electron gun shown in FIG. 2B. The radius of curvature of the front end of the chip is 15 $\mu$m, and the orientation of the chip is <310>. The ordinate of FIG. 6 (representing the luminous intensity B) is a logarithmic scale. As seen from FIG. 3, R is substantially constant with respect to θ. As seen from FIG. 4, θ increases as θ increases. Thus, the product θR increases as θ increases, as shown in FIG. 5. For satisfying relatinos (3) and (6), the half the vertical angle φ of the cathode chip must be between 60° and 80°. The temperature T of the cathode chip is set below 1,600° C. maximum value at which the operation of the electron gun does not become unstable. The bias voltage V of the electron gun is selected to be within a range so that the electron beam provides the maximum luminous intensity. For uniformly illuminating the first shaping plate 28, the electron gun is used under the conditions of the space-charge restricting region. Under these conditions and T<1,600° C., R and φ do not change much but B changes significantly when the chip temperature T and the bias voltage V are varied. This means that the desired luminous intensity may be obtained within the above-mentioned range (chip temperature T<1,600° C. in the space-charge restricting region). As may be seen from FIG. 6, Θ≦80° must be satisfied to satisfy the condition of relation (4) B≈2×10$^5$ A/cm$^2$·str. The condition of relation (7) B≈6×10$^3$ A/cm$^2$·str applies to any value of θ. Thus, the conditions may be easily satisfied when θ is greater. However, when θ is great, the load current flowing through the high voltage power source of the electron gun disadvantageously increases. For this reason, it is preferred that θ not be made greater than necessary.

From the above, it is seen that θ, half the vertical angle must satisfy 80°≦θ≦90° from the conditions of φR≦100 mard·μm and B≈6×10$^3$ A/cm$^2$·str when the maximum area of the aperture image is 50 μm$^2$. However, since it is preferable to make θ as small as possible, the upper limit of θ is set to be 85°. It is also seen that θ, half the vertical angle needs to satisfy 60°≦θ≦80° from the conditions φR≦40 mard·μm and B≈2×10$^5$ A/cm$^2$·str when the maximum area of the aperture image is 2 μm$^2$. With a variable shaping electron beam exposing apparatus with the maximum area of the aperture image being 2 to 50 μm$^2$, the drawing pattern of sufficient brightness may be formed on the sample with uniformity and high precision when θ, half the vertical angle of the cathode chip of the electron gun satisfies 60°≦θ≦85°.

When θ, half the vertical angle of the cathode chip of the variable shaping electron beam exposing apparatus of 2 μm$^2$ maximum aperture image are is 70°, it has been confirmed that an ideal drawing pattern is obtained, and the service life of the cathode chip exceeds 1,000 hours.

The cathode chip 52 is made of single-crystal LaB$_6$. Since the single-crystal LaB$_6$ exhibits anisotropy in its work function, the intensity distribution pattern of the electron beam from the LaB$_6$ electron gun (intensity distribution pattern at the aperture) and the intensity distribution pattern of the crossover image are not isotropic. However, this anisotropy depends on the chip temperature. As an example, changes in the intensity distribution pattern at the aperture with respect to the chip temperature when half the vertical angle of the chip is 45° and the axial orientation is <100> are shown in FIGS. 7A to 7D. FIGS. 7A, 7B, 7C and 7D show the patterns when the chip temperature was 1,400° C., 1,500° C., 1550° C., and 1,600° C., respectively. The intensity distribution patterns of the crossover image corresponding to FIGS. 7A to 7D are shown in FIGS. 8A to 8D, respectively. For making the current density constant and for uniformly making the drawing pattern of the aperture image, the intensity distribution pattern on the aperture image needs to be isotropic. This condition is satisfied when the chip temperature is 1,600° C. as shown in FIG. 7D.

It has been confirmed by experiment that the anisotropy of the patterns of the aperture image and the crossover image tends to be weakened as θ, half the vertical angle of the cathode chip, increases. As an example, the changes of the intensity distribution pattern of the aperture image with respect to the chip temperature when θ, half the vertical angle of the chip, is 70° and the axial orientation is <100> are shown in FIGS. 9A to 9E. FIGS. 9A, 9B, 9C, 9D and 9E show the aperture image patterns when the chip temperature was 1,300° C., 1,400° C., 1,500° C., 1,550° C. and 1,600° C., respectively. The intensity distribution patterns of the crossover image corresponding to FIGS. 9A to 9E are shown in FIGS. 10A to 10E. When θ, half the vertical angle, is made great, namely 70° C., the intensity distribution pattern of the aperture image already shows isotropy when the chip temperature is 1,500° C. as shown in FIG. 9C, so that the drawing may be reguarly and uniformly performed at a lower temperature.

It has been confirmed that the bright angles in the angular patterns shown in FIGS. 8A to 8D correspond to the plane (310) of the chip, that is, the irradiation of the electron beam is performed from the vicinity of the plane (310) of the cathode chip. Therefore, the electron beam may be easily irradiated from the front surface of the chip and the intensity distribution of the aperture image becomes isotropic when the axis of the single-crystal LaB$_6$ for the cathode chip is set to orientation <310>.

Thus, since the product φR is great and the isotropy of the intensity distribution pattern with respect to the angle of the section of the beam is improved with an electron beam having a single-crystal LaB$_6$ cathode wherein the axial orientation is <310> and θ, half the vertical angle of the front end, satisfies 60°≦θ≦85°, a variable shaping type exposing apparatus of the aperture image projecting type having desired characteristics may be provided. Since the crossover image becomes circular even at a lower temperature as shown in FIGS. 10A to 10E with the LaB$_6$ electron gun used in this apparatus, it may be applicable to an apparatus which is required to irradiate an electron beam of great current and 2 to 5 μm beam diameter, such as a scanning electron beam annealing apparatus.

Although the cathode chip was described as being made of single-crystal LaB$_6$, it is not necessarily limited to this. The changes in the characteristics of the electron beam with respect to changes in θ, half the vertical angle, are functionally related to the electron optics and are not related to the materials. The characteristics of the material influence the liminance and service life. A material with a high work function W does not reach a predetermined luminance when not operating at a high temperature, and the service life of the cathode material is determined by the amount of evaporation at the operating temperature. Therefore, the performance of the cathode material is evaluated by W/Te (figure of merit) where Te is the temperature at which the cathode material reaches a vapor pressure of 1×10$^{-5}$ Torr and sublinates. Thus, an excellent cathode material has a smaller W/Te. It thus follows that cathode materials with W/Te equal to or less than that of LaB$_6$ may be used as the cathode of the electron gun of the electron beam exposing apparatus. W/Te of LaB$_6$ is $1.27 \times 10^{-3}$ eV/deg. Typical examples of materials having W/Te equal to or less than $1.5 \times 10^{-3}$ eV/deg include zirconium carbide (ZrC), titanium carbide (TiC), tantalum carbide (TaC), and hafnium carbide (HfC). The cathode may be made of a material which is a mixture of such material to a material containing LaB$_6$, with an impurity.

What we claim is:

1. An electron beam exposing apparatus comprising:
   an electron gun having a cathode which is made of a single-crystal lanthanum hexaboride and which is shaped into a cone with half the vertical angle being between 60° and 85° such that the spread of the electron beam is kept below a predetermined value, that the luminous intensity of the electron beam is increased while still keeping said spread below said predetermined value and that the current density in a variably shaped aperture is kept uniform;
   means for heating said cathode at a given temperature to irradiate an electron beam of which a crossover image and an emission pattern are circular;
   means, including openings of variable shape, for shaping the electron beam irradiated from said cathode into the shapes of the openings; and
   means for focusing the shaped beam to form a beam spot having an area of 2 to 50 $\mu m^2$ on a sample.

2. An electron beam exposing apparatus according to claim 1, wherein the axis of said cathode is oriented toward <100>.

3. An electron beam exposing apparatus according to claim 1, in which said cathode is made of a single-crystal lanthanum hexaboride with an impurity.

4. An electron beam exposing apparatus according to claim 1, in which said cathode is shaped into a circular cone.

5. An electron beam exposing apparatus according to claim 1, in which said cathode is shaped into a pyramidal cone.

6. An electron beam exposing apparatus according to claim 1, wherein the axis of said cathode is oriented toward <310>.

* * * * *